(12) United States Patent
Alameer et al.

(10) Patent No.: US 10,770,129 B2
(45) Date of Patent: Sep. 8, 2020

(54) PSEUDO-CHANNELED DRAM

(71) Applicant: Intel Corporation, Santa Clara, CA (US)

(72) Inventors: Hussein Alameer, Portland, OR (US); Kjersten Criss, Beaverton, OR (US); Uksong Kang, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 66 days.

(21) Appl. No.: 16/106,911

(22) Filed: Aug. 21, 2018

(65) Prior Publication Data

US 2019/0043552 A1 Feb. 7, 2019

(51) Int. Cl.
| | | |
|---|---|---|
| *G11C 5/06* | (2006.01) | |
| *G11C 11/4076* | (2006.01) | |
| *H01L 27/02* | (2006.01) | |
| *G11C 5/04* | (2006.01) | |
| *G06F 12/08* | (2016.01) | |
| *G11C 11/4093* | (2006.01) | |

(52) U.S. Cl.
CPC .......... *G11C 11/4076* (2013.01); *G06F 12/08* (2013.01); *G11C 5/04* (2013.01); *G11C 5/066* (2013.01); *G11C 11/4093* (2013.01); *H01L 27/0207* (2013.01); *G11C 2207/105* (2013.01)

(58) Field of Classification Search
CPC ....... G11C 11/4076; G11C 5/04; G11C 5/066; G11C 11/4093; G06F 12/08; H01L 27/0207
See application file for complete search history.

(56) References Cited

U.S. PATENT DOCUMENTS

| | | | |
|---|---|---|---|
| 10,162,522 B1 * | 12/2018 | Li | G06F 13/1626 |
| 2016/0139988 A1 * | 5/2016 | Muralimanohar | G06F 11/1004 714/766 |
| 2019/0050325 A1 * | 2/2019 | Malladi | G06N 3/063 |
| 2019/0179791 A1 * | 6/2019 | Shokrollahi | G11C 11/4093 |
| 2019/0348107 A1 * | 11/2019 | Shin | G11C 11/40622 |

OTHER PUBLICATIONS

JEDEC, "JEDEC Updates Groundbreaking High Bandwidth Memory (HBM) Standard", Jan. 22, 2016, 3 pages.

* cited by examiner

*Primary Examiner* — Toan K Le
(74) *Attorney, Agent, or Firm* — Jordan IP Law, LLC (57) ABSTRACT

An embodiment of a semiconductor apparatus may include technology to provide two or more dynamic random access memory devices, and provide access to the two or more dynamic random access memory devices with two or more pseudo-channels per memory channel. Other embodiments are disclosed and claimed.

19 Claims, 8 Drawing Sheets

| | DDR5 [Base] | Two X16 Pseudo-channels | Four X8 Pseudo-channels | Sub-channels |
|---|---|---|---|---|
| Data rate/pin | 3.2~6.4GT/s | 8~16GT/s | 8~16GT/s | 8~16GT/s |
| IO width/ch | X32 | X32 | X32 | X16 |
| #ch/ DIMM | 2 | 2 | 2 | 4 |
| #pch/ch | 1 | 2 | 4 | 1 |
| Burst length | BL16 | BL32 | BL64 | BL32 |
| #Bank/die | 32 | 64 (32*2 pch) | 64 (16*4 pch) | 32 |
| Prefetch/bank | 64 | 64 | 64 | 128 |
| Min #BG step | 1x | 1x | 0.5x | 1x |
| x4 ECC | SDDC | SDDC | SDDC | SEC-DED |
| x4 ECC Capacity Overhead | 25% | 25% | 25% | 25% |
| Latency | 1x | 1x | 2x (+6ns @ 8GT/s) | 1x |
| Power/die | Full width | Half width | Quarter width | Full width |
| tRRd/tFAW for full BW | 1x | 0.5x* | 0.5x* | 1x |
| CA BW | 0.5x | 1x | 1x | 0.5x |
| Other Notes | | DQS pair shared among pch | DQS pair shared among pch | |

\* Assuming that tRRD and tFAW need to observed across pseudo-channel within a die

FIG. 8

|  | Savings @ ¼ width [x4] | Savings @ ½ width [x4] | Savings @ ¼ width [x8] | Savings @ ½ width [x8] |
| --- | --- | --- | --- | --- |
| IDD4R@3.2GT/s | 9.3% | 6.2% | 14.7% | 9.8% |
| IDD4W@3.2GT/s | 7.8% | 5.2% | 12.9% | 8.6% |

FIG. 9

| Sub-channels | ECC Type | Overhead |
| --- | --- | --- |
| Two X16 Pseudo-channels | SDDC | 25% |
| Four X8 Pseudo-channels | SDDC | 25% |
| | ½ Device | 25% |
| | SDDC | 50% |

PSEUDO-CHANNELED DRAM

TECHNICAL FIELD

Embodiments generally relate to memory devices. More particularly, embodiments relate to pseudo-channeled dynamic random access memory (DRAM).

BACKGROUND

DRAM devices may be found in many electronic devices/systems. Multiple DRAM devices are commonly co-located on modules such as dual-inline memory modules (DIMMs). High bandwidth memory (HBM) is a memory technology that provides a wide word memory access in a single device. The Joint Electron Device Engineering Council (JEDEC) published an updated HBM specification JED235A in 2016 (www.jedec.org).

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Various embodiments described herein may include a memory component and/or an interface to a memory component. Such memory components may include volatile and/or nonvolatile memory (NVM). Volatile memory may be a storage medium that requires power to maintain the state of data stored by the medium. Non-limiting examples of volatile memory may include various types of random access memory (RAM), such as dynamic RAM (DRAM) or static RAM (SRAM). One particular type of DRAM that may be used in a memory module is synchronous dynamic RAM (SDRAM). In particular embodiments, DRAM of a memory component may comply with a standard promulgated by JEDEC, such as JESD79F for double data rate (DDR) SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

NVM may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor RAM (FeTRAM), anti-ferroelectric memory, magnetoresistive RAM (MRAM) memory that incorporates memristor technology, resistive memory including the metal oxide base, the oxygen vacancy base and the conductive bridge RAM (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product. In particular embodiments, a memory component with non-volatile memory may comply with one or more standards promulgated by the JEDEC, such as JESD218, JESD219, JESD220-1, JESD223B, JESD223-1, or other suitable standard (the JEDEC standards cited herein are available at jedec.org).

Figure 1:
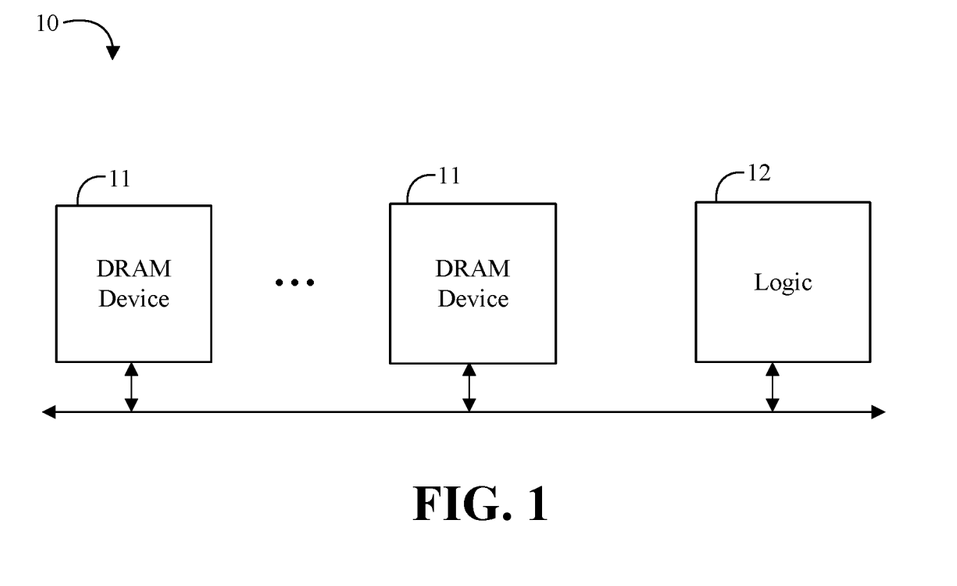
FIG. 1 is a block diagram of an example of a memory system according to an embodiment.

Turning now to FIG. 1, an embodiment of a memory system 10 may include two or more DRAM devices 11, and logic 12 communicatively coupled to the two or more DRAM devices 11 to provide access to the two or more DRAM devices 11 with two or more pseudo-channels per memory channel. In some embodiments, the logic 12 may be configured to dedicate data pins for each of the pseudo-channels, and share command address pins between at least two of the two or more pseudo-channels. For example, the logic 12 may be configured to share data strobe pins between at least two of the two or more pseudo-channels. In some embodiments, the logic 12 may be further configured to provide single device data correction for the two or more DRAM devices 11. The logic 12 may also be configured to provide double data rate data transfer (e.g., compliant with a DDR-based standard). In some embodiments, each of the two or more DRAM devices 11 may include a four bit data width, or each of the two or more DRAM devices 11 may include an eight bit data width (e.g., as described in more detail herein). In some embodiments, the two or more DRAM devices 11 may be mounted on a dual-inline memory module (DIMM). In some embodiments, the logic 12 may be located in, or co-located with, various components, including the DRAM devices 11 (e.g., on a same die).

Embodiments of each of the above DRAM devices 11, logic 12, and other system components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof. Embodiments of the logic 12 may also include a general purpose processor, a special purpose processor, a central processor unit (CPU), a controller, a micro-controller, etc.

Alternatively, or additionally, all or portions of these components may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C # or the like and conventional procedural programming languages, such as the "C" programming language or similar programming languages. For example, the DRAM devices 11, persistent storage media, or other system memory may store a set of instructions which when executed by a processor cause the system 10 to implement one or more components, features, or aspects of the system 10 (e.g., the logic 12, providing access to the two or more DRAM devices 11 with two or more pseudo-channels per memory channel, etc.).

Figure 2:
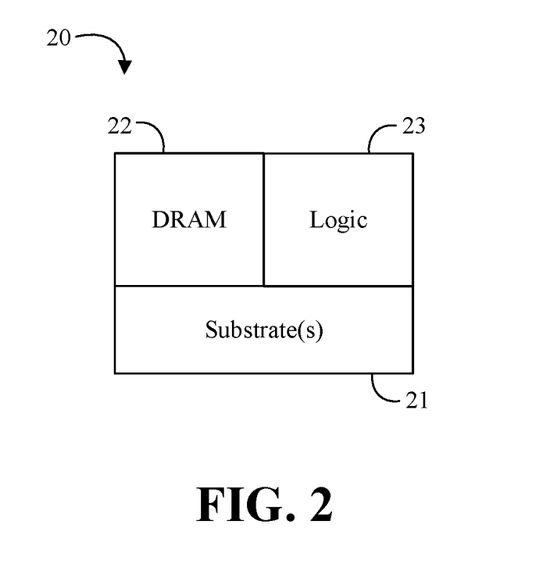
FIG. 2 is a block diagram of an example of a semiconductor apparatus according to an embodiment.

Turning now to FIG. 2, an embodiment of a semiconductor apparatus 20 may include one or more substrates 21, DRAM 22 coupled to the one or more substrates, and logic 23 coupled to the one or more substrates 21, wherein the logic 23 is at least partly implemented in one or more of configurable logic and fixed-functionality hardware logic. The logic 23 coupled to the one or more substrates 21 may be configured to layout the DRAM 22 with two or more pseudo-channels per memory channel. In some embodiments, the logic 23 may be configured to dedicate data pins for each of the pseudo-channels, and share command address pins between at least two of the two or more pseudo-channels. For example, the logic 23 may be configured to share data strobe pins between at least two of the two or more pseudo-channels. In some embodiments, the logic 23 may be further configured to provide single device data correction for the DRAM 22. The logic 23 may also be configured to provide double data rate data transfer (e.g., compliant with a DDR-based standard). In some embodiments, the DRAM 22 may include a four bit data width, or the DRAM 22 may include an eight bit data width (e.g., as described in more detail herein). In some embodiments, the logic 23 coupled to the one or more substrates 21 may include transistor channel regions that are positioned within the one or more substrates 21.

Embodiments of logic 23, and other components of the apparatus 20, may be implemented in hardware, software, or any combination thereof including at least a partial implementation in hardware. For example, hardware implementations may include configurable logic such as, for example, PLAs, FPGAs, CPLDs, or fixed-functionality logic hardware using circuit technology such as, for example, ASIC, CMOS, or TTL technology, or any combination thereof. Additionally, portions of these components may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C # or the like and conventional procedural programming languages, such as the "C" programming language or similar programming languages.

The apparatus 20 may implement one or more aspects of the method 30 (FIGS. 3A to 3C), or any of the embodiments discussed herein. In some embodiments, the illustrated apparatus 20 may include the one or more substrates 21 (e.g., silicon, sapphire, gallium arsenide) and the logic 23 (e.g., transistor array and other integrated circuit/IC components) coupled to the substrate(s) 21. The logic 23 may be implemented at least partly in configurable logic or fixed-functionality logic hardware. In one example, the logic 23 may include transistor channel regions that are positioned (e.g., embedded) within the substrate(s) 21. Thus, the interface between the logic 23 and the substrate(s) 21 may not be an abrupt junction. The logic 23 may also be considered to include an epitaxial layer that is grown on an initial wafer of the substrate(s) 21.

Figure 3A:
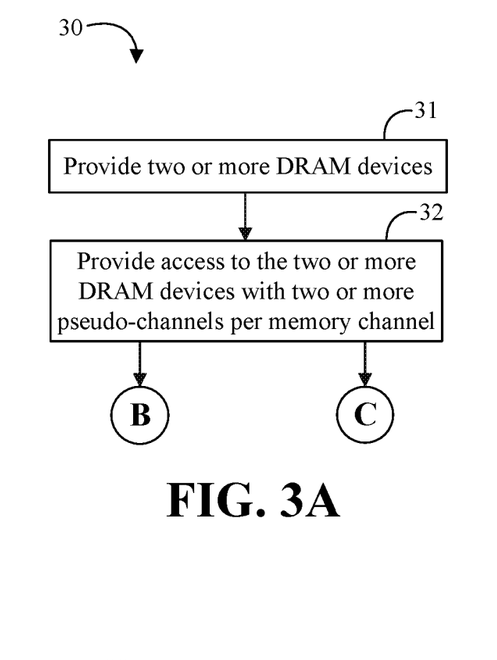
FIGS. 3A to 3C are flowcharts of an example of a method of organizing memory according to an embodiment.
Figure 3B:
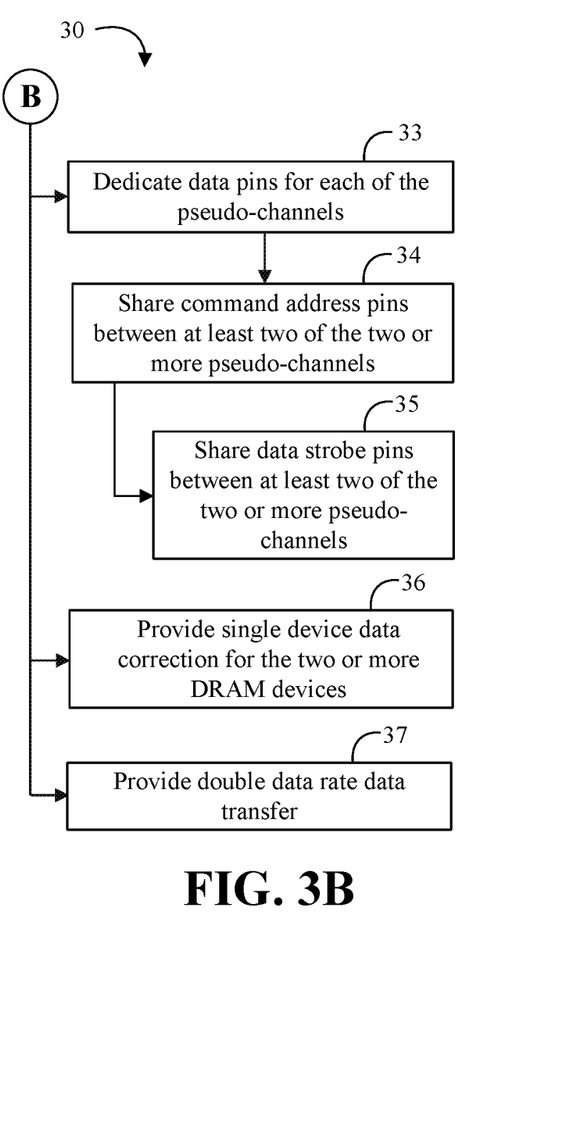
Figure 3C:
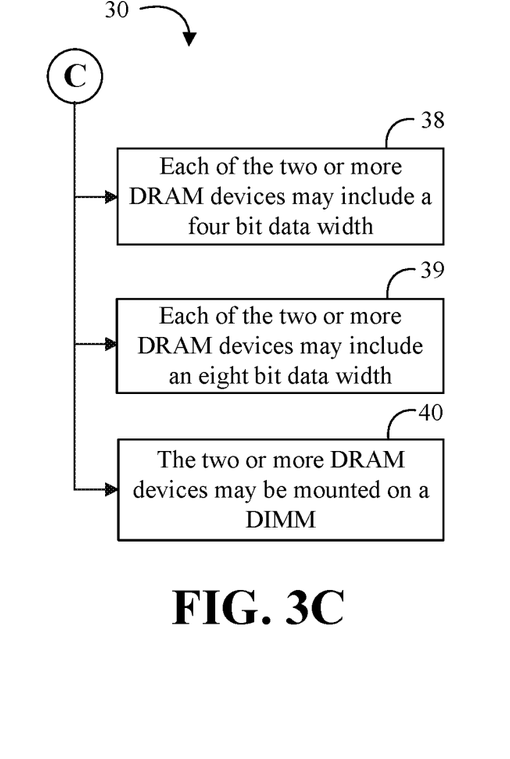

Turning now to FIGS. 3A to 3C, an embodiment of a method 30 of organizing memory may include providing two or more DRAM devices at block 31, and providing access to the two or more DRAM devices with two or more pseudo-channels per memory channel at block 32. Some embodiments of the method 30 may include dedicating data pins for each of the pseudo-channels at block 33, and sharing command address pins between at least two of the two or more pseudo-channels at block 34. For example, the method 30 may include sharing data strobe pins between at least two of the two or more pseudo-channels at block 35. Some embodiments of the method 30 may also include providing single device data correction for the two or more DRAM devices at block 36, and/or providing double data rate data transfer at block 37. In some embodiments, each of the two or more DRAM devices may include a four bit data width at block 38, each of the two or more DRAM devices may include an eight bit data width at block 39, and/or the two or more DRAM devices may mounted on a DIMM at block 40.

Embodiments of the method 30 may be implemented in a system, apparatus, computer, device, etc., for example, such as those described herein. More particularly, hardware implementations of the method 30 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 30 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C # or the like and conventional procedural programming languages, such as the "C" programming language or similar programming languages.

For example, the method 30 may be implemented on a computer readable medium as described in connection with Examples 25 to 32 below. Embodiments or portions of the method 30 may be implemented in firmware, applications (e.g., through an application programming interface (API)), or driver software running on an operating system (OS). Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Some embodiments may advantageously provide a pseudo-channeled DRAM architecture for DDR-based memory devices (e.g., including future DDR generations such as DDR5, etc.). DRAM memory technology demands may be generally increasing (e.g., increasing bandwidth, decreasing power consumption, etc.). Some embodiments may advantageously increase the bandwidth (e.g., by two times) while maintaining the same or lower power, and also maintaining the reliability, availability and serviceability (RAS), with a pseudo-channeled DRAM architecture.

Some other memory technologies may include module threading technology, micro-threading technology, and/or sub-channel technology. With module threading technology, for example, a proposed DDR5 DIMM may have a data bus width of X64 with two channels (X32/channel) and a burst length of BL16 resulting in a cache line size of 64B for a given single column access (e.g., where X<n> corresponds to a bit width of <n>; X64 corresponds to a bit width of 64, X32 corresponds to a bit width of 32, etc.). However, the data bus is divided into two halves creating two sub-channels (each X16). Each sub-channel is selected by two chip selects (C/S0, C/S1). To build a cache line size of 64B for each sub-channel, two column accesses are needed back-to-back, resulting in a total burst length of BL32. Because the burst length becomes doubled, the core is less likely to run into row-activate-to-row-activate delay (tRRD) and four bank activation window (tFAW) limitations. A problem with module threading technology is that two more X4 DRAMs would have to be added per sub channel in order to support chip-kill (e.g., protection for single chip failure), which may be an important feature for servers requiring high reliability. The extra DRAMs correspond to a chip capacity overhead of 50%, which is a big cost burden.

With micro-threading technology, assuming a conventional DRAM having a X32-bit wide bus, burst length of BL16, and 8 logical banks, for example, the minimum data access granularity would be X32*BL16=64B. Assuming that two column accesses can be issued within tRRD, the row access data granularity becomes 128B. A single DRAM is divided into two sub-channels (X16/sub-channel). A single cache line size becomes X16*BL16=32B, which allows a finer data access granularity of 32B. A problem with micro threading technology is that performance improvements may be provided in only those applications which can benefit from finer granularity accesses. It does not apply to general applications where the baseline cache line size is 64B. In the case of micro threading, the burst length is not doubled even though the bus width is reduced by half for each sub channel. In other words, the cache line size of 64B is not maintained per sub-channel but decreased by half.

With some other DDR-based memory technology, the width per channel is cut in half and the burst length is doubled to BL32 per channel. For a single DIMM layout, this means there are four sub-channels per DIMM. This technology keeps the same number of banks per die but needs to double the prefetch bits per bank to 128-bits for X4 devices and 256-bits for X8 devices. This sub-channel technology does allow certain DRAM parameters such as tRRD and tFAW to be the same as proposed for DDR5 even though the transfer speed is two times the baseline. Some problems with this sub-channel technology is that it requires extra pins for each of the separate new sub-channels, and it does not support single device data correction (SDDC) for X4 devices (e.g., which may be required in some data center applications). The sub-channel technology may support SDDC using a hypothetical X2 device configuration, but using such X2 devices imposes extra cost and form-factor complexity to achieve the same performance and RAS capability compared with proposed DDR5 X4 devices. HBM technology may include a pseudo-channel architecture which is suitable for wide word, single device implementations. However, the HBM pseudo-channel technology may not be technically feasible for multiple device implementations such as DRAM DIMMs.

Some embodiments may advantageously provide pseudo-channel technology for DDR-based memory devices (e.g., to enhance the DDR5 architecture) and corresponding module configurations (e.g., DIMMs, small-outline DIMMs (SO-DIMMs), etc.). Some embodiments may allow DDR-based memory devices to achieve speeds up to 16 giga-transfers per second (GT/s) without making substantial changes to the device or module layout. For example, some embodiments may advantageously keep the current channel and module layout, do not increase pin count per channel, maintain a same level of RAS as DDR5, and/or may provide power savings compared with other architectures.

Figure 4A:
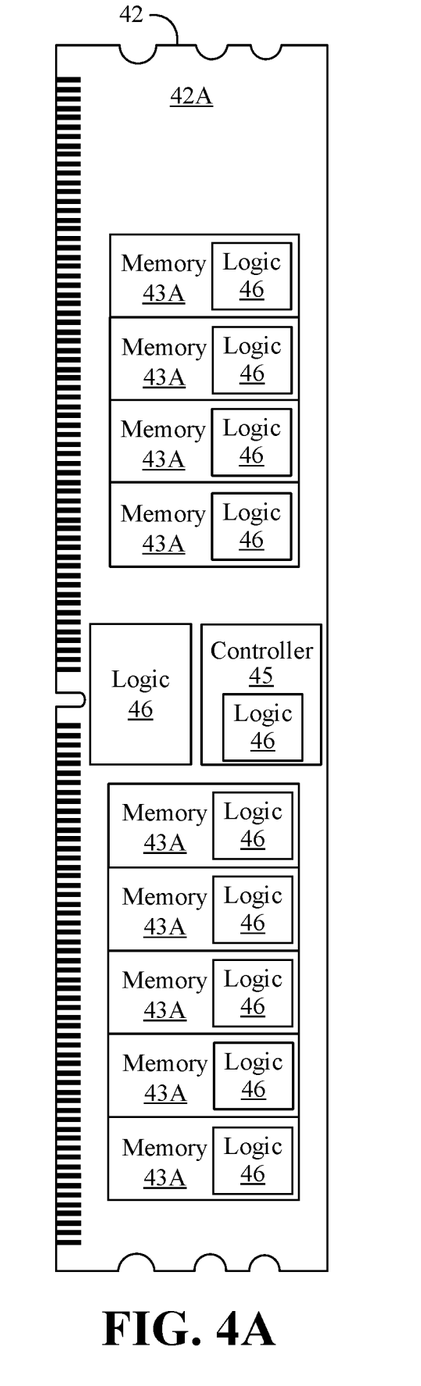
FIGS. 4A to 4B are illustrative diagrams of opposite sides of an example of a DIMM according to an embodiment.
Figure 4B:
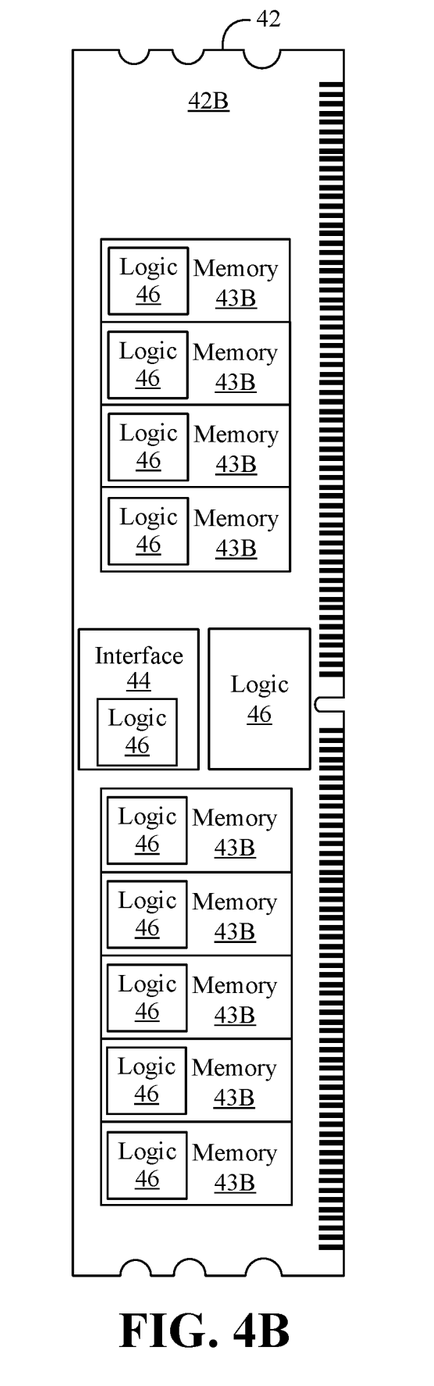

Turning now to FIGS. 4A to 4B, an embodiment of a DIMM 42 may include eight X4 DRAM devices 43A on a first side 42A of the DIMM 42 to form a first X32 memory channel, and eight X4 DRAM devices 43B on a second side 42B of the DIMM 42 to form a second X32 memory channel. The DIMM 42 may also include extra DRAM devices 43A and/or 43B used for error code correction (ECC). The DIMM 42 may use the two X32 memory channels to form a X64 width interface. The number of pins shown in FIGS. 4A to 4B is for illustration purposes only, and more or fewer pins may be provided in various embodiments. The DIMM 42 may include additional components, circuitry, and logic to provide DDR-based, standards compliant memory. For example, the DIMM 42 may include, among other things, interface component(s) 44, a controller 45, and logic 46 (e.g., which may be distributed throughout the DIMM 42). For example, the logic 46 may be configured to provide access to the DRAM devices 43A and 43B with two or more pseudo-channels per memory channel. In some embodiments, the logic 46 may be configured to dedicate data pins for each of the pseudo-channels, and share command address pins between at least two of the two or more pseudo-channels. For example, the logic 46 may be configured to share data strobe pins between at least two of the two or more pseudo-channels. In some embodiments, the logic 46 may be further configured to provide single device data correction for the DRAM devices 43A and 43B. The logic 46 may also be configured to provide double data rate data transfer (e.g., compliant with a DDR-based standard).

Figure 5A:
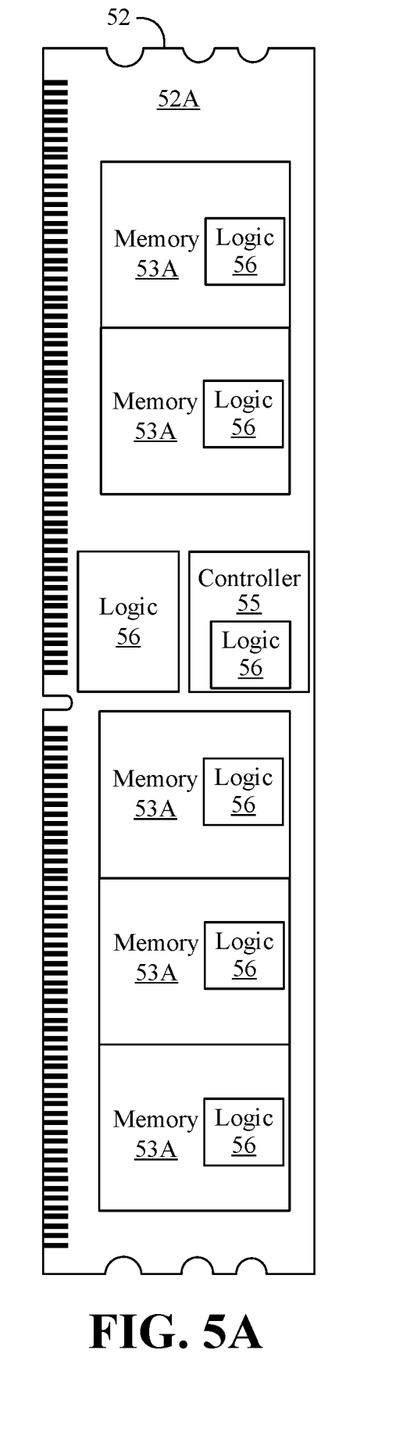
FIGS. 5A to 5B are illustrative diagrams of opposite sides of another example of a DIMM according to an embodiment.
Figure 5B:
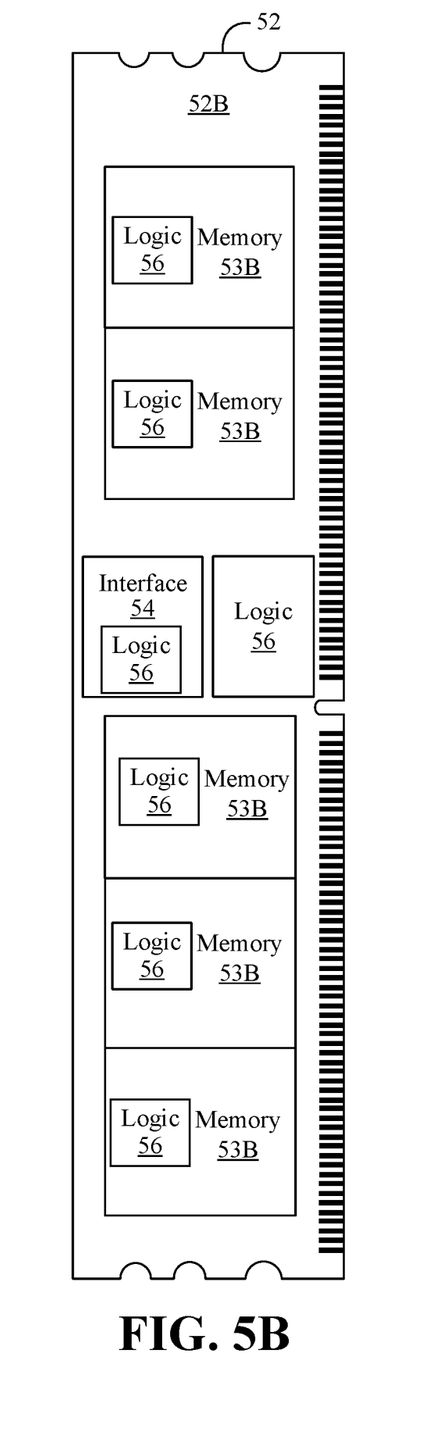

Turning now to FIGS. 5A to 5B, a DIMM 52 may include four X8 DRAM devices 53A on a first side 52A of the DIMM 52 to form a first X32 memory channel, and four X8 DRAM devices 53B on a second side 52B of the DIMM 52 to form a second X32 memory channel. The DIMM 52 may also include extra DRAM devices 53A and/or 53B used for error code correction (ECC). The DIMM 52 may use the two X32 memory channels to form a X64 width interface. The number of pins shown in FIGS. 5A to 5B is for illustration purposes only, and more or fewer pins may be provided in various embodiments. The DIMM 52 may include additional components, circuitry, and logic to provide DDR-based, standards compliant memory. For example, the DIMM 52 may include, among other things, interface component(s) 54, a controller 55, and logic 56 (e.g., which may be distributed throughout the DIMM 52). For example, the logic 56 may be configured to provide access to the DRAM devices 53A and 53B with two or more pseudo-channels per memory channel. In some embodiments, the logic 56 may be configured to dedicate data pins for each of the pseudo-channels, and share command address pins between at least two of the two or more pseudo-channels. For example, the logic 56 may be configured to share data strobe pins between at least two of the two or more pseudo-channels. In some embodiments, the logic 56 may be further configured to provide single device data correction for the DRAM devices 53A and 53B. The logic 56 may also be configured to provide double data rate data transfer (e.g., compliant with a DDR-based standard).

Figure 6A:
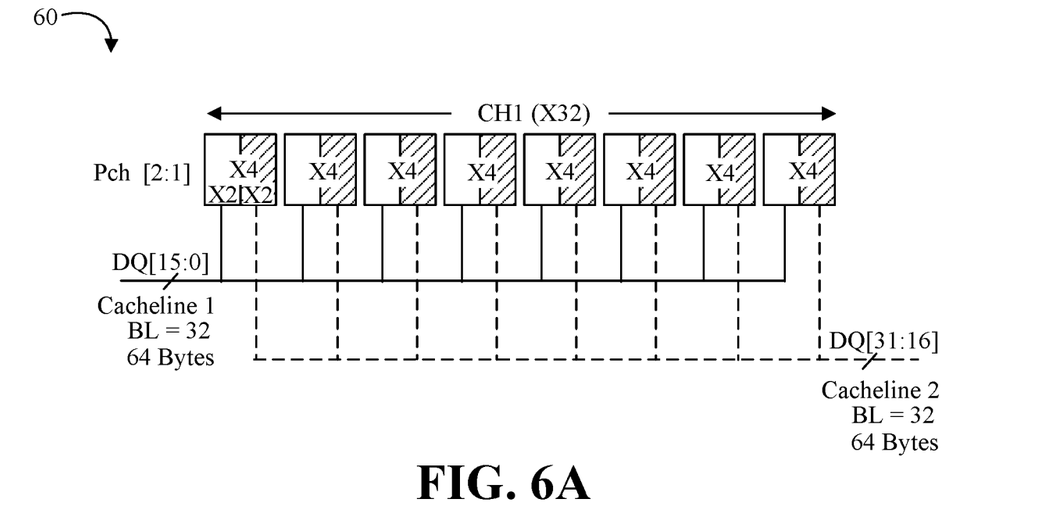
FIGS. 6A to 6C are respective block diagrams and a legend for example layouts of respective memory systems according to an embodiment.
Figure 6B:
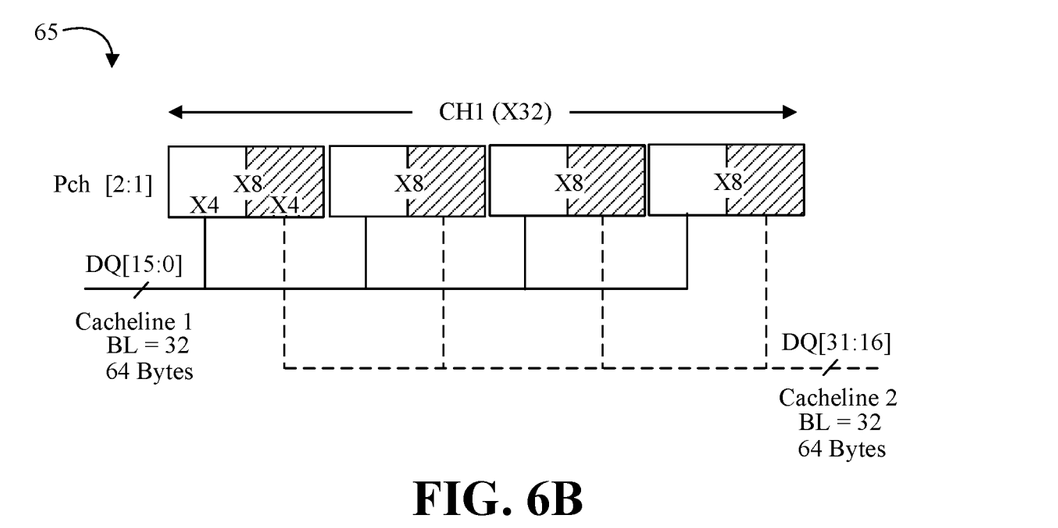
Figure 6C:
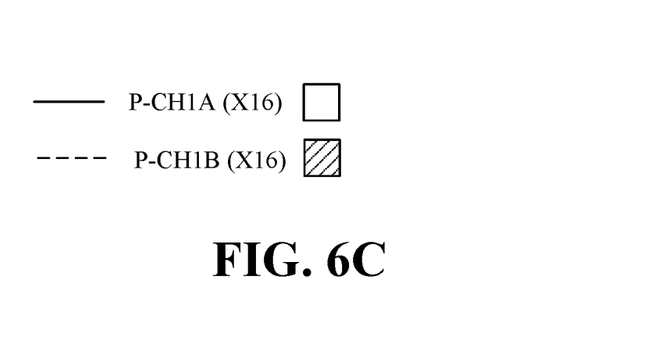

Turning now to FIGS. 6A to 6C, embodiments of respective memory systems 60 and 65 each include two X16 pseudo-channels per memory channel (e.g., see FIG. 6C for a corresponding legend). An embodiment of a memory system 60 (FIG. 6A) may include eight (8) X4 devices M0 through M7 per rank to form an X32 width channel CH1. The system 60 may be mounted on one side of a DIMM, with another set of eight devices on the other side of the DIMM to form a second X32 channel CH2 (not shown), for an overall X64 width interface for the DIMM. The DIMM may also include extra devices used for error code correction (ECC), an I/O interface, a memory controller, etc. The memory system 60 may include a DDR-based architecture (e.g., a DDR5-like architecture) and may apply pseudo-channel technology to the DDR-based architecture. In some embodiments, a pseudo-channel may effectively correspond to a channel that has its own unique data pins but shares the command address pins with other pseudo-channel within a channel. Advantageously, utilizing pseudo-channel technology may reduce the overhead of adding extra pins per channel. For example, the memory system 60 may include the same X32 channel interface as proposed for DDR5 and may include the same pin count as proposed for DDR5.

As shown in FIG. 6A, the X32 channel CH1 may contain two X16 pseudo-channels P-CH1A and P-CH1B (e.g., each comprising an X2 half of each of the memory devices M0 through M7). A first cacheline DQ[15:0] may be coupled to one of the pseudo-channels P-CH1A, while a second cacheline DQ[31:16] may be coupled to the other pseudo-channel P-CH1B. To keep the same pin count, some embodiments may share the data strobes (e.g., DQS pairs) amongst the pseudo-channels P-CH1A and P-CH1B. Organizing the memory system 60 to share data strobes may add a restriction that all pseudo-channels within a channel perform reads together or writes together (e.g., one pseudo-channel cannot be reading while the other is writing and vice-versa).

Turning now to FIG. 6B, an embodiment of a memory system 65 may include four (4) X8 devices M0 through M3 per rank to form an X32 width channel CH1. The system 65 may be mounted on one side of a DIMM, with another set of four devices on the other side of the DIMM to form a second X32 channel, for an overall X64 width interface for the DIMM. The DIMM may also include extra devices used for error code correction (ECC), an I/O interface, a memory controller, etc. The memory system 65 may include a DDR-based architecture (e.g., a DDR5-like architecture) and may apply pseudo-channel technology to the DDR-based architecture. In some embodiments, a pseudo-channel may effectively correspond to a channel that has its own unique data pins but shares the command address pins with other pseudo-channel within a channel. Advantageously, utilizing pseudo-channel technology may reduce the overhead of adding extra pins per channel. For example, the memory system 65 may include the same X32 channel interface as proposed for DDR5 and may include the same pin count as DDR5.

As shown in FIG. 6B, the X32 channel CH1 may contain two X16 pseudo-channels P-CH1A and P-CH1B (e.g., each comprising an X4 half of each of the memory devices M0 through M3). A first cacheline DQ[15:0] may be coupled to one of the pseudo-channels P-CH1A, while a second cacheline DQ[31:16] may be coupled to the other pseudo-channel P-CH1B. To keep the same pin count, some embodiments may share the data strobes (e.g., DQS pairs) amongst the pseudo-channels P-CH1A and P-CH1B. Organizing the memory system 65 to share data strobes may add a restriction such that all pseudo-channels within a channel perform reads together or writes together (e.g., one pseudo-channel within a channel cannot be reading while the other is writing and vice-versa).

In some embodiments of the memory systems 60 and 65, the burst length per pseudo-channel may advantageously be doubled, and each pseudo-channel may have a X16 data width compared with the baseline. Each pseudo-channel may maintain a bank count of 32, which may allow doubling the transfer speed while obtaining the same/similar efficiencies as proposed for DDR5. For a X4 device layout, some embodiments may advantageously also provide SDDC features. Advantageously, the prefetch bits per bank may remain the same at 64-bits per X4 device, or 128-bits per X8 device, to obtain a 64-byte cache line.

Some embodiments of the memory systems 60 and 65 may also advantageously provide power savings per device by limiting the distance data needs to travel to up to half the device width (e.g., as compared to other memory devices where data may need to travel up to the full device width). Per pseudo-channel, the systems 60 and 65 may have the same amount of interleaving among bank groups as compared with the baseline.

Figure 7A:
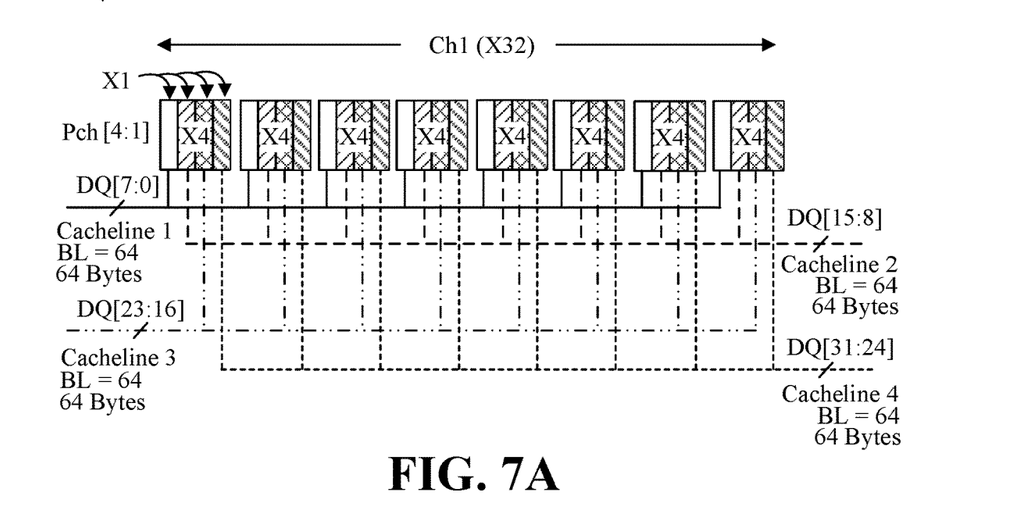
FIGS. 7A to 7C are respective block diagrams and a legend for other example layouts of respective memory systems according to an embodiment.
Figure 7B:
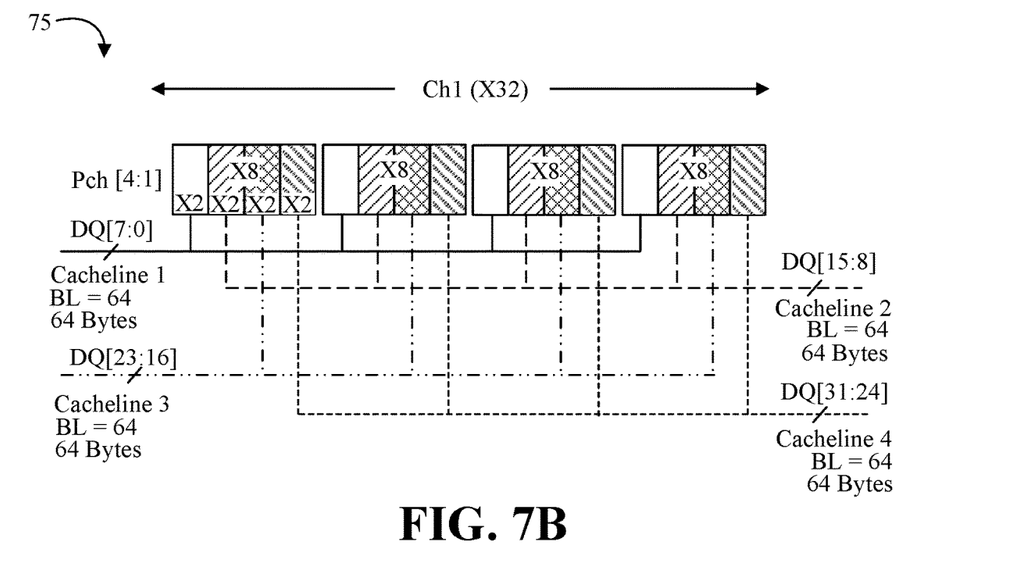
Figure 7C:
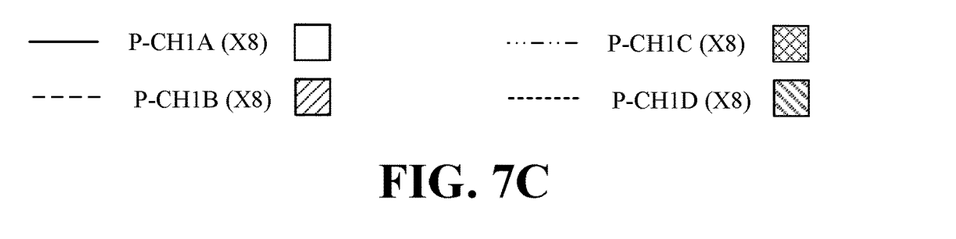

Turning now to FIGS. 7A to 7C, embodiments of respective memory systems 70 and 75 each include four X8 pseudo-channels per memory channel (e.g., see FIG. 7C for a corresponding legend). An embodiment of a memory system 70 (FIG. 7A) may include eight (8) X4 devices M0 through M7 per rank to form an X32 width channel CH1. The system 70 may be mounted on one side of a DIMM, with another set of eight devices on the other side of the DIMM to form a second X32 channel, for an overall X64 width interface for the DIMM. The DIMM may also include extra devices used for error code correction (ECC), an I/O interface, a memory controller, etc. The memory system 70 may include a DDR-based architecture (e.g., a DDR5-like architecture) and may apply pseudo-channel technology to the DDR-based architecture. In some embodiments, a pseudo-channel may effectively correspond to a channel that has its own unique data pins but shares the command address pins with other pseudo-channel within a channel. Advantageously, utilizing pseudo-channel technology may reduce the overhead of adding extra pins per channel. For example, the memory system 70 may include the same X32 channel interface as proposed for DDR5 and may include the same pin count as DDR5.

As shown in FIG. 7A, the X32 channel CH1 may contain four X8 pseudo-channels P-CH1A, P-CH1B, P-CH1C, and PCH1D (e.g., each comprising an X1 quarter of each of the memory devices M0 through M7). A first cacheline DQ[7:0] may be coupled to a first one of the pseudo-channels P-CH1A, a second cacheline DQ[15:8] may be coupled to a second one of the pseudo-channels P-CH1B, a third cacheline DQ[23:16] may be coupled to a third one of the pseudo-channels P-CH1C, and a fourth cacheline DQ[31:24] may be coupled to a fourth one of the pseudo-channels P-CH1D. To keep the same pin count, some embodiments may share the data strobes (e.g., DQS pairs) amongst the pseudo-channels P-CH1A through P-CH1D. Organizing the memory system 70 to share data strobes may add a restriction that all pseudo-channels within a channel perform reads together or writes together (e.g., one pseudo-channel cannot be reading while the other is writing and vice-versa).

Turning now to FIG. 7B, an embodiment of a memory system 75 may include four (4) X8 devices M0 through M3 per rank to form an X32 width channel CH1. The system 75 may be mounted on one side of a DIMM, with another set of eight devices on the other side of the DIMM to form a second X32 channel, for an overall X64 width interface for the DIMM. The DIMM may also include extra devices used for error code correction (ECC), an I/O interface, a memory controller, etc. The memory system 75 may include a DDR-based architecture (e.g., a DDR5-like architecture) and may apply pseudo-channel technology to the DDR-based architecture. In some embodiments, a pseudo-channel may effectively correspond to a channel that has its own unique data pins but shares the command address pins with other pseudo-channel within a channel. Advantageously, utilizing pseudo-channel technology may reduce the overhead of adding extra pins per channel. For example, the memory system 75 may include the same X32 channel interface as proposed for DDR5 and may include the same pin count as DDR5.

As shown in FIG. 7B, the X32 channel CH1 may contain four X8 pseudo-channels P-CH1A, P-CH1B, P-CH1C, and PCH1D (e.g., each comprising an X2 quarter of each of the memory devices M0 through M3). A first cacheline DQ[7:0] may be coupled to a first one of the pseudo-channels P-CH1A, a second cacheline DQ[15:8] may be coupled to a second one of the pseudo-channels P-CH1B, a third cacheline DQ[23:16] may be coupled to a third one of the pseudo-channels P-CH1C, and a fourth cacheline DQ[31:24] may be coupled to a fourth one of the pseudo-channels P-CH1D. To keep the same pin count, some embodiments may share the data strobes (e.g., DQS pairs) amongst the pseudo-channels P-CH1A through P-CH1D. Organizing the memory system 75 to share data strobes may add a restriction that all pseudo-channels within a channel perform reads together or writes together (e.g., one pseudo-channel cannot be reading while the other is writing and vice-versa).

Compared with the memory systems 60 and 65, the memory systems 70 and 75 may quadruple the burst length of DDR5 at BL64. A fixed two times (2×) latency adder may be incurred per request due to the longer burst length. Advantageously, the power savings per device may be even higher for the memory systems 70 and 75 because the distance data needs to travel may be limited to up to one quarter of the device width. The bank count per pseudo-channel may be only 16 to obtain the same efficiencies as proposed for DDR5. Per pseudo-channel, the memory systems 70 and 75 may interleave half the amount of bank groups compared with the baseline, and the core frequency of the DRAM may be reduced.

Figure 8:
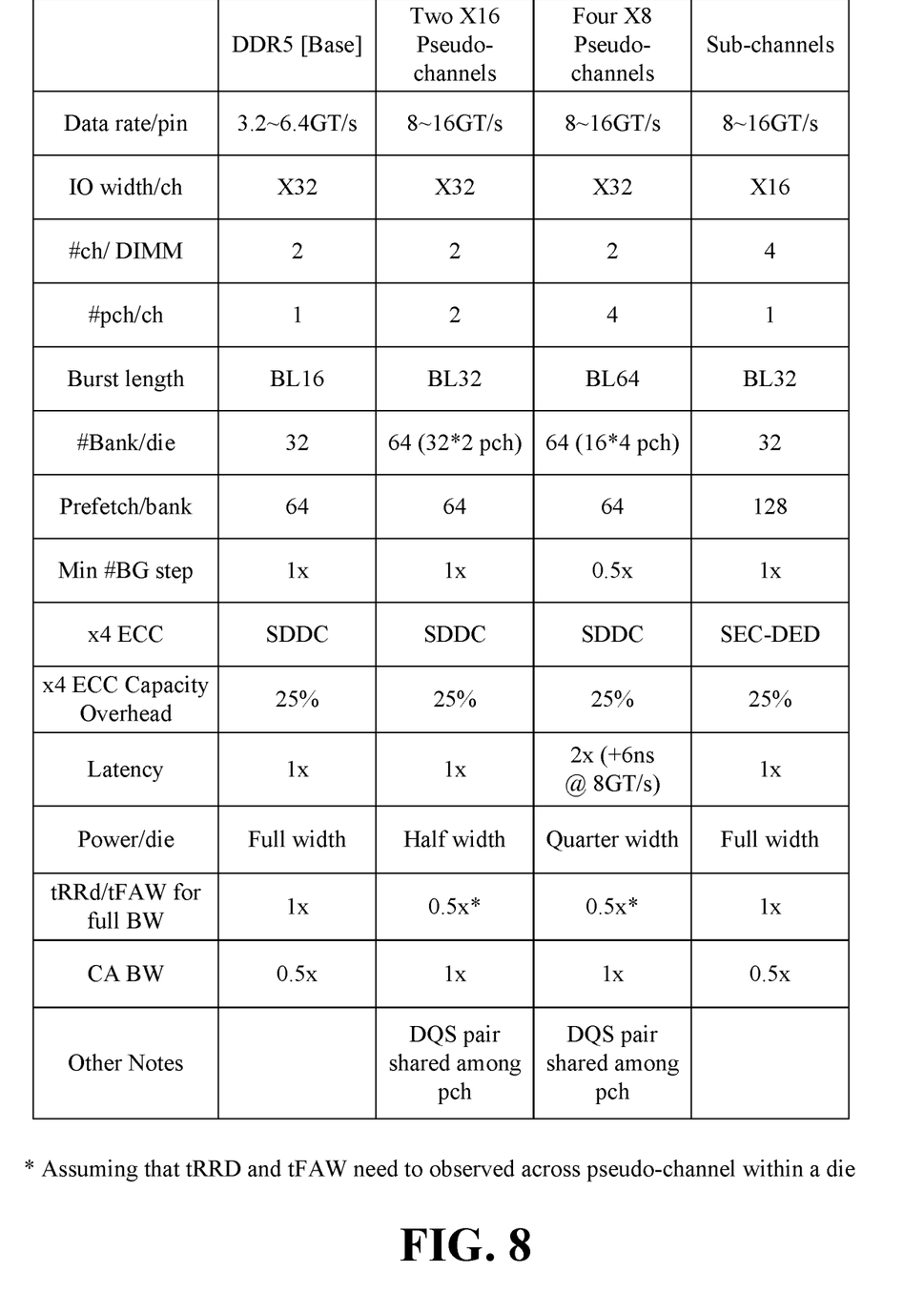
FIG. 8 is an illustrative comparison table of various parameters for different memory architectures according to embodiments.

Without being limited to particular implementations, FIG. 8 may show an illustrative comparison of various parameters between proposed DDR5 technology (e.g., a baseline), an embodiment with two X16 pseudo-channels per memory channel, an embodiment with four X8 pseudo-channels per memory channels, and sub-channel technology.

Figure 9:
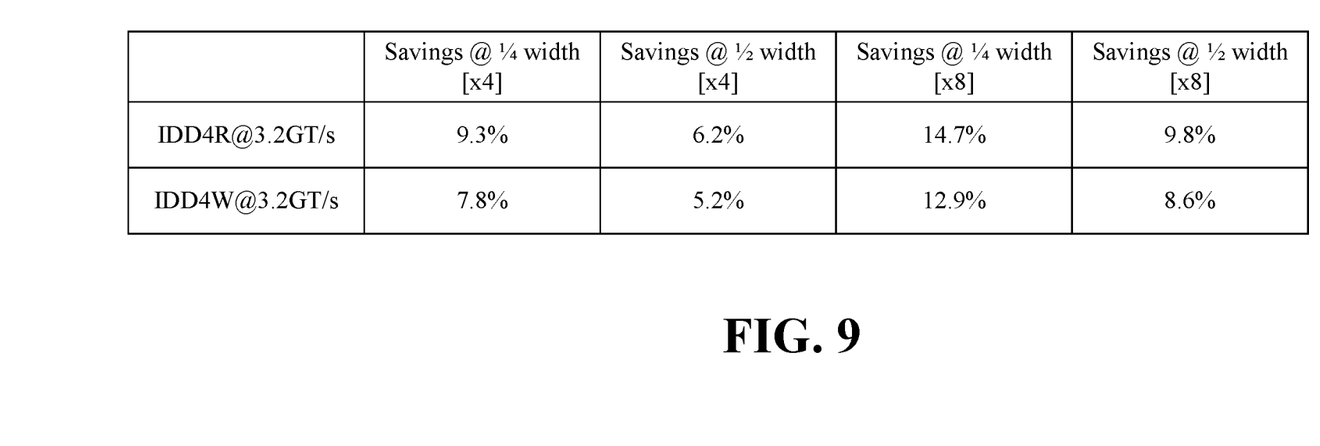
FIG. 9 is an illustrative table of various potential power savings according to embodiments.

Without being limited to particular implementations, FIG. 9 may show potential power savings for embodiments of a pseudo-channeled DRAM architecture. Assuming an 8 Gbit per die density running at 3.2 GT/s, FIG. 11 shows initial estimates for the potential power savings depending on the length data needs to travel along the width of the device.

Figure 10:
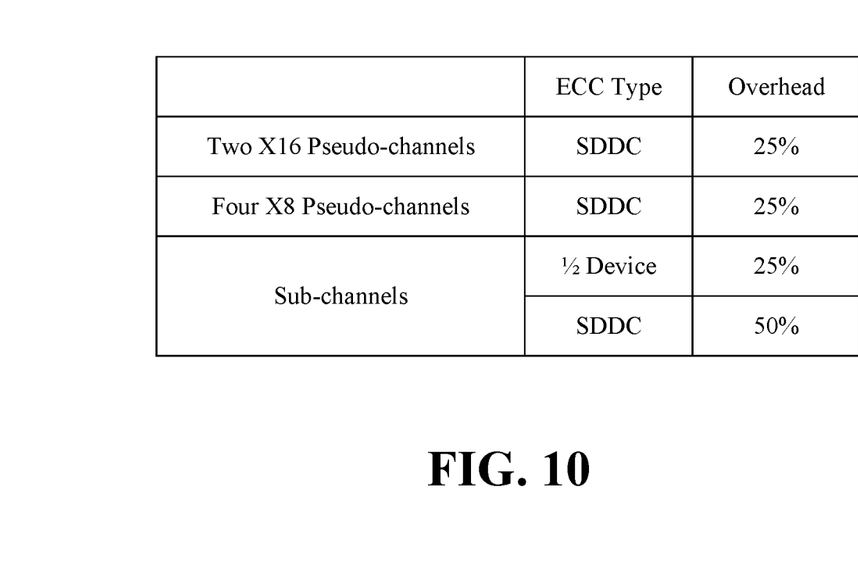
FIG. 10 is an illustrative comparison table of an error correction technique according to embodiments.

Without being limited to particular implementations, FIG. 10 may show an illustrative comparison for an ECC option for X4 devices between an embodiment with two X16 pseudo-channels per memory channel, an embodiment with four X8 pseudo-channels per memory channels, and sub-channel technology.

Additional Notes and Examples

Example 1 may include a memory system, comprising two or more dynamic random access memory devices, and logic communicatively coupled to the two or more dynamic random access memory devices to provide access to the two or more dynamic random access memory devices with two or more pseudo-channels per memory channel.

Example 2 may include the system of Example 1, wherein the logic is further to dedicate data pins for each of the pseudo-channels, and share command address pins between at least two of the two or more pseudo-channels.

Example 3 may include the system of Example 2, wherein the logic is further to share data strobe pins between at least two of the two or more pseudo-channels.

Example 4 may include the system of Example 3, wherein the logic is further to provide single device data correction for the two or more dynamic random access memory devices.

Example 5 may include the system of any of Examples 1 to 4, wherein the logic is further to provide double data rate data transfer.

Example 6 may include the system of any of Examples 1 to 5, wherein each of the two or more dynamic random access memory devices has a four bit data width.

Example 7 may include the system of any of Examples 1 to 6, wherein each of the two or more dynamic random access memory devices has an eight bit data width.

Example 8 may include the system of any of Examples 1 to 7, wherein the two or more dynamic random access memory devices are mounted on a dual-inline memory module.

Example 9 may include a semiconductor apparatus, comprising one or more substrates, dynamic random access memory coupled to the one or more substrates, and logic coupled to the one or more substrates and the dynamic random access memory cells, wherein the logic is at least partly implemented in one or more of configurable logic and fixed-functionality hardware logic, the logic coupled to the one or more substrates to layout the dynamic random access memory with two or more pseudo-channels per memory channel.

Example 10 may include the apparatus of Example 9, wherein the logic is further to dedicate data pins for each of the pseudo-channels, and share command address pins between at least two of the two or more pseudo-channels.

Example 11 may include the apparatus of Example 10, wherein the logic is further to share data strobe pins between at least two of the two or more pseudo-channels.

Example 12 may include the apparatus of Example 11, wherein the logic is further to provide single device data correction for the dynamic random access memory.

Example 13 may include the apparatus of any of Examples 9 to 12, wherein the logic is further to provide double data rate data transfer.

Example 14 may include the apparatus of any of Examples 9 to 13, wherein the dynamic random access memory has a four bit data width.

Example 15 may include the apparatus of any of Examples 9 to 14, wherein the dynamic random access memory has an eight bit data width.

Example 16 may include the apparatus of any of Examples 9 to 15, wherein the logic coupled to the one or more substrates includes transistor channel regions that are positioned within the one or more substrates.

Example 17 may include a method of organizing memory, comprising providing two or more dynamic random access memory devices, and providing access to the two or more dynamic random access memory devices with two or more pseudo-channels per memory channel.

Example 18 may include the method of Example 17, further comprising dedicating data pins for each of the pseudo-channels, and sharing command address pins between at least two of the two or more pseudo-channels.

Example 19 may include the method of Example 18, further comprising sharing data strobe pins between at least two of the two or more pseudo-channels.

Example 20 may include the method of Example 19, further comprising providing single device data correction for the two or more dynamic random access memory devices.

Example 21 may include the method of any of Examples 17 to 20, further comprising providing double data rate data transfer.

Example 22 may include the method of any of Examples 17 to 21, wherein each of the two or more dynamic random access memory devices has a four bit data width.

Example 23 may include the method of any of Examples 17 to 22, wherein each of the two or more dynamic random access memory devices has an eight bit data width.

Example 24 may include the method of any of Examples 17 to 23, wherein the two or more dynamic random access memory devices are mounted on a dual-inline memory module.

Example 25 may include at least one computer readable storage medium, comprising a set of instructions, which when executed by a computing device, cause the computing device to provide two or more dynamic random access memory devices, and provide access to the two or more dynamic random access memory devices with two or more pseudo-channels per memory channel.

Example 26 may include the at least one computer readable storage medium of Example 25, comprising a further set of instructions, which when executed by the computing device, cause the computing device to dedicate data pins for each of the pseudo-channels, and share command address pins between at least two of the two or more pseudo-channels.

Example 27 may include the at least one computer readable storage medium of Example 20, comprising a further set of instructions, which when executed by the computing device, cause the computing device to share data strobe pins between at least two of the two or more pseudo-channels.

Example 28 may include the at least one computer readable storage medium of Example 20, comprising a further set of instructions, which when executed by the computing device, cause the computing device to provide single device data correction for the two or more dynamic random access memory devices.

Example 29 may include the at least one computer readable storage medium of Example 20, comprising a further set of instructions, which when executed by the computing device, cause the computing device to provide double data rate data transfer.

Example 30 may include the at least one computer readable storage medium of any of Examples 17 to 21, wherein each of the two or more dynamic random access memory devices has a four bit data width.

Example 31 may include the at least one computer readable storage medium of any of Examples 17 to 22, wherein each of the two or more dynamic random access memory devices has an eight bit data width.

Example 32 may include the at least one computer readable storage medium of any of Examples 17 to 23, wherein the two or more dynamic random access memory devices are mounted on a dual-inline memory module.

Example 33 may include a memory apparatus, comprising two or more dynamic random access memory devices, and means for providing access to the two or more dynamic random access memory devices with two or more pseudo-channels per memory channel.

Example 34 may include the apparatus of Example 33, further comprising means for dedicating data pins for each of the pseudo-channels, and means for sharing command address pins between at least two of the two or more pseudo-channels.

Example 35 may include the apparatus of Example 34, further comprising means for sharing data strobe pins between at least two of the two or more pseudo-channels.

Example 36 may include the apparatus of Example 35, further comprising means for providing single device data correction for the two or more dynamic random access memory devices.

Example 37 may include the apparatus of any of Examples 33 to 36, further comprising means for providing double data rate data transfer.

Example 38 may include the apparatus of any of Examples 33 to 37, wherein each of the two or more dynamic random access memory devices has a four bit data width.

Example 39 may include the apparatus of any of Examples 33 to 38, wherein each of the two or more dynamic random access memory devices has an eight bit data width.

Example 40 may include the apparatus of any of Examples 33 to 39, wherein the two or more dynamic random access memory devices are mounted on a dual-inline memory module.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A memory system, comprising:
   two or more dynamic random access memory devices; and
   logic communicatively coupled to the two or more dynamic random access memory devices to:
   provide access to the two or more dynamic random access memory devices with two or more pseudo-channels per memory channel;
   dedicate data pins for each of the pseudo-channels; and
   share command address pins between at least two of the two or more pseudo-channels.

2. The system of claim 1, wherein the logic is further to:
   share data strobe pins between at least two of the two or more pseudo-channels.

3. The system of claim 2, wherein the logic is further to:
   provide single device data correction for the two or more dynamic random access memory devices.

4. The system of claim 1, wherein the logic is further to:
   provide double data rate data transfer.

5. The system of claim 1, wherein each of the two or more dynamic random access memory devices has a four bit data width.

6. The system of claim 1, wherein each of the two or more dynamic random access memory devices has an eight bit data width.

7. The system of claim 1, wherein the two or more dynamic random access memory devices are mounted on a dual-inline memory module.

8. A semiconductor apparatus, comprising:
   one or more substrates;
   dynamic random access memory coupled to the one or more substrates; and
   logic coupled to the one or more substrates and the dynamic random access memory, wherein the logic is at least partly implemented in one or more of configurable logic and fixed-functionality hardware logic, the logic coupled to the one or more substrates to:
   layout the dynamic random access memory with two or more pseudo-channels per memory channel; and
   dedicate data pins for each of the pseudo-channels.

9. The apparatus of claim 8, wherein the logic is further to:
   share command address pins between at least two of the two or more pseudo-channels.

10. The apparatus of claim 9, wherein the logic is further to:
    share data strobe pins between at least two of the two or more pseudo-channels.

11. The apparatus of claim 10, wherein the logic is further to:
    provide single device data correction for the dynamic random access memory.

12. The apparatus of claim 8, wherein the logic is further to:
    provide double data rate data transfer.

13. The apparatus of claim 8, wherein the dynamic random access memory has a four bit data width.

14. The apparatus of claim 8, wherein the dynamic random access memory has an eight bit data width.

15. The apparatus of claim 8, wherein the logic coupled to the one or more substrates includes transistor channel regions that are positioned within the one or more substrates.

16. A method of organizing memory, comprising:
    providing two or more dynamic random access memory devices; and
    providing access to the two or more dynamic random access memory devices with two or more pseudo-channels per memory channel; and
    sharing command address pins between at least two of the two or more pseudo-channels.

17. The method of claim 16, further comprising:
    dedicating data pins for each of the pseudo-channels.

18. The method of claim 17, further comprising:
    sharing data strobe pins between at least two of the two or more pseudo-channels.

19. The method of claim 18, further comprising:
providing single device data correction for the two or more dynamic random access memory devices.

* * * * *